United States Patent
Mui et al.

(10) Patent No.: US 6,693,020 B2
(45) Date of Patent: Feb. 17, 2004

(54) METHOD OF PREPARING COPPER METALLIZATION DIE FOR WIREBONDING

(75) Inventors: Kok Wai Mui, Selangor (MY); Fuaida Bte Harun, Selangor (MY); Lan Chu Tan, Selangor (MY); Mohd Faizairi Bin Mohd Nor, Leeds (GB)

(73) Assignee: Motorola, Inc., Schaumburg, IL (US)

( * ) Notice: Subject to any disclaimer, the term of this patent is extended or adjusted under 35 U.S.C. 154(b) by 294 days.

(21) Appl. No.: 09/803,749

(22) Filed: Mar. 12, 2001

(65) Prior Publication Data

US 2002/0127825 A1 Sep. 12, 2002

(51) Int. Cl.$^7$ ............................................. H01L 21/322
(52) U.S. Cl. ........................................ 438/475; 438/905
(58) Field of Search ................................. 438/474, 475, 438/478, 648, 687, 684, 689, 704, 706, 745, 905

(56) References Cited

U.S. PATENT DOCUMENTS

| | | | | |
|---|---|---|---|---|
| 4,764,244 A | * | 8/1988 | Chitty et al. | 156/630 |
| 5,409,777 A | * | 4/1995 | Kenndy et al. | 428/411.1 |
| 5,482,174 A | | 1/1996 | Namiki et al. | |
| 6,170,235 B1 | | 1/2001 | Cho et al. | |
| 6,355,571 B1 | * | 3/2002 | Huang et al. | 438/706 |
| 6,440,854 B1 | * | 8/2002 | Rozbicki | 438/687 |

FOREIGN PATENT DOCUMENTS

| | | |
|---|---|---|
| JP | 2101156 A | 4/1990 |
| WO | WO 00/59029 | 10/2000 |

OTHER PUBLICATIONS

Website for The Nordic Electronics Packaging Guideline, "Chapter A: Wire Bonding", A1, pp. 1–4,A2 pp. 1–18, A4 pp. 1–8.

Website for Small Precision Tools, "Copper Wire Ultra Fine Pitch Bonding—The Natural Progression in IC Assembly Technology?", Jurg Notzli et al. pp. 1–11.

* cited by examiner

*Primary Examiner*—David Nhu

(57) ABSTRACT

A method of preparing a semiconductor wafer having a integrated circuits formed on it that have pads formed of copper includes the steps of removing oxide from the copper pads and then the vacuum packing the wafer in a shock-proof container. The oxide may be removed from the copper pads in a number of ways. A first way includes cleaning the wafer in an alkaline solution, performing acid neutralization on the cleaned wafer, and then drying the wafer. A second way includes cleaning the wafer with an acid solution, rinsing the acid cleaned wafer with water, applying an anti-oxidant activator to the surface of the copper pads, rinsing the wafer with water after the application of the anti-oxidant activator, and then drying the water rinsed wafer. Yet a third way includes plasma cleaning the copper pads using a combination of about 5–10% Hydrogen and about 90–95% Argon and then sputtering a very thin layer of aluminum on a surface of the copper pads. The layer of aluminum has a thickness of about 1–5 nanometers.

13 Claims, 1 Drawing Sheet

METHOD OF PREPARING COPPER METALLIZATION DIE FOR WIREBONDING

BACKGROUND OF THE INVENTION

1. Field of the Invention

The present invention relates to integrated circuits and, more particularly, to a method of preparing semiconductor wafers having die with copper pads to allow for more reliable wire bonding.

2. Background of Related Art

An integrated circuit (IC) die is a small device cut from a semiconductor wafer, such as a silicon wafer, on which multiple die have been formed. Such die are typically packaged to protect them from corrosion by attaching them to lead frames using a solder or epoxy. A die is electrically connected to leads in the lead frame, and then the die and the lead frame are encapsulated in a plastic package. The leads of the lead frame protrude from the package and terminate in pins that allow the die to be electrically connected with other circuits, such as on a printed circuit board.

Referring to FIG. 4, a conventional process for packaging a die is shown. First, at step 40, a die is cut or sawn from the wafer on which it has been formed. After the die has been cut from the wafer, the back side of the die is firmly attached to a carrier or lead frame in a die bonding or die attach step 42. Typically, in the die bonding step 42, the die is attached to the lead frame using an organic adhesive, such as an epoxy and then cured by baking. Once the epoxy has cured, in step 44 the die is wire bonded to the lead frame.

FIG. 5 is an enlarged cross-sectional view of a packaged integrated circuit 50. The packaged circuit 50 includes a die 51 bonded to a die attach pad 52. The die 51 is connected to a lead frame 53 by wires 54. Further, the die 51, die attach pad 52, wires 54 and part of the lead frame 53 are encapsulated or molded in a package 55. The package 55 may be plastic, metal, ceramic or another known packaging material.

The wires 54 connect bonding pads of the die 51 to bonding pads on the lead frame 53. The most common die-connection technology is wire bonding. Wire bonding is a solid phase welding process where two metallic materials, a very thin wire and a pad surface, are brought into contact. Once the surfaces are in contact, a combination of heat, pressure and/or ultrasonic energy is used to cause electron sharing or inter-diffusion of atoms, resulting in the formation of a wire bond.

Wire bonding is typically done using one of three industry standard techniques: thermo-compression (T/C) bonding, which uses a combination of pressure and elevated temperature; thermo-sonic (T/S) bonding, which uses a combination of pressure, elevated temperature, and ultrasonic vibration bursts; and ultrasonic (U/S) bonding, which uses a combination of pressure and ultrasonic vibration bursts. These wire bonding techniques are well known. The preferred bond wire material is gold, although other materials are also used, such as silver, aluminum/silicon, aluminum/magnesium, palladium, and copper.

Referring again to FIG. 4, after the wire bonding step 44, the back side of the die is cleaned, typically by ultraviolet-ozone (UVO) cleaning. In UVO cleaning, a UV-ozone cleaner that emits significant amounts of radiation is used to remove organic contaminants from the die. Finally, the die and lead frame assembly is molded, step 48, forming the packaged circuit 50 shown in FIG. 5.

In the last few years, there has been a renewed interest in using copper wire, as opposed to aluminum, in ICs due to the desire for higher clock rates and improved thermal management, as well as the ability to perform fine pitch and ultra-fine pitch copper wire bonding. In order to prevent intermetallic phases, it is preferred to bond copper wires to copper pads.

Unfortunately, copper tends to oxidize and corrode fairly quickly. Corrosion can open one or both ends of the wire bond completely, allowing the wire to move within the package, thereby causing electrical short circuits. The corrosion occurs in the presence of moisture and contaminants. For example, the presence of chlorine or bromine at the bonding area can cause the formation of chlorides or bromides, leading to bond corrosion. Bond corrosion also increases the electrical resistance of the wire bond interconnect. Thus, forming a reliable copper-to-copper bond can be difficult. Accordingly, it would be advantageous to have a pad surface to which wires may be bonded more reliably.

SUMMARY OF THE INVENTION

In order to provide more reliable wire bonds, the present invention provides a method of preparing a semiconductor wafer having a plurality of integrated circuits formed thereon, the integrated circuits having pads formed of copper. In the method, oxide is removed from the copper pads and then the wafer is vacuum packed in a shock-proof container. The oxide may be removed from the copper pads in a number of ways. A first way includes cleaning the wafer in an alkaline solution, performing acid neutralization on the cleaned wafer, and then drying the wafer. A second way includes cleaning the wafer with an acid solution, such as by dipping the wafer in a bath of $H_2SO_4$ or $HNO_3$, rinsing the acid cleaned wafer with water, applying an anti-oxidant activator to the surface of the copper pads, rinsing the wafer with water after the application of the anti-oxidant activator, and then drying the water rinsed wafer. Yet a third way includes plasma cleaning the copper pads using about 5–10% Hydrogen and about 90–95% Argon in an ultra low vacuum pressure of about 5–20 mTorr and then sputtering a very thin layer of oxide passivation, such as aluminum on a surface of the copper pads. The layer of oxide passivation has a thickness on the order of about 1 to about 10 nanometers.

The present invention further provides a method of electrically connecting a copper pad of an integrated circuit with a pad of a lead frame with a copper wire, including the steps of plasma cleaning the copper pad using about 5–10% Hydrogen and about 90–95% Argon and then wire bonding the wire to the cleaned copper pad and the lead frame pad.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
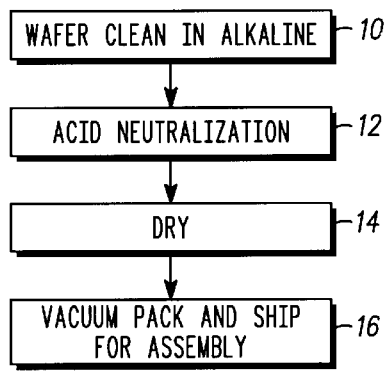
FIG. 1 is a block diagram illustrating the steps involved in the preparation of a semiconductor wafer having one or more integrated circuits formed thereon in accordance with a first embodiment of the invention.

The detailed description set forth below in connection with the appended drawings is intended as a description of the presently preferred embodiments of the invention, and is not intended to represent the only forms in which the present invention may be practiced. The description sets forth sequences of steps for performing the procedures in connection with the illustrated embodiments. It is to be understood, however, that the same or equivalent functions and sequences may be accomplished by different embodiments that are intended to be encompassed within the spirit and scope of the invention. In the drawings, like numerals are used to indicate like elements throughout.

As previously discussed, it has become popular to fabricate integrated circuits using copper interconnect metallization technology due to the advantages in electrical performance and cost. In order to prevent intermetallic phases, the ICs are provided with copper pads. Typically, wire bonding of the IC with the chip carrier or lead frame is performed using gold and aluminum wire materials, although copper and silver have also been used. Bonding these wires to different pad materials produces different metallurgical systems. Thus, for the same reason that the IC is provided with copper pads, it is preferable to use copper wire to connect the copper pad of the IC to the lead frame.

Unfortunately, copper oxidizes very quickly, making it more difficult to achieve a reliable wire bond. Thus, to ensure bondability and reliability of the wire bond, one of the critical conditions is that the bonding surface must be free of any contaminants. Typically circuits are formed on wafers at one place and then the wafers are transported to another place where the circuits are cut from the wafer and packaged. Since considerable time may pass between the wafer fabrication and the packaging processes, oxidation of the copper pads can occur during such time. Accordingly, the present invention provides for cleaning the copper pads of an integrated circuit after fabrication of the circuit on a wafer, but before the wafer has been packed for shipping to the packaging location.

Referring now to FIG. 1, a first method of preparing a semiconductor wafer having a plurality of integrated circuits formed thereon, the integrated circuits having pads formed of copper, is shown. Methods of forming circuits with copper pads on a silicon wafer are known and a detailed discussion thereof is not required for an understanding of the present invention. It is understood that the processes of the present invention are performed after an integrated circuit(s) has been formed on the wafer. Generally, this is after all layers have been applied to the wafer and the wafer has been rinsed in deionized water and the back of the wafer has been ground to remove unnecessary material, and further, preferably after testing of each chip or die has been performed. Typically, after testing is performed, the wafer is cleaned again using solvents such as deionized water, isopropyl alcohol, acetone, and methanol. The present invention is directed to the cleaning performed after the wafer has undergone testing and provides for removing oxides from the copper pads and then vacuum packing the wafer.

More specifically, beginning at step 10, the wafer and particularly the copper pads of each die are cleaned in alkaline. Preferably, the wafer is cleaned with an alkaline solution by dipping or immersing the wafer in an alkaline bath for between about 1 to about 20 seconds at room temperature. Alkaline solutions for removing oxides are commonly used in manufacturing lead frames and are known by those of ordinary skill in the art.

After the wafer is removed from the alkaline bath, an acid neutralization step 12 is performed. The acid neutralization step 12 preferably is performed by dipping or immersing the wafer in an acid bath at room temperature for about 1 to about 20 seconds in order to ensure that all of the oxide has been removed from the copper pads. The acid used is preferably $H_2SO_4$ or $HNO_3$, however, other acids may be used, such as phosphoric, hydrogen peroxide, hydrofluoric, and hydrochloric, which are commercially available and commonly used in semiconductor fabrication processes. However, it will be understood by those of ordinary skill in the art that other acids, such as citric acid, may be used.

After the acid neutralization step 12, the wafer is dried at step 14. The wafer may be dried using either ambient or warm air and/or a commercial blow dryer. Alternatively, the wafer may be dried using compressed air or a gas, such as nitrogen. The drying time may vary from a few seconds to a few minutes. However, it is preferred that the wafer is not exposed to ambient air for an extended period of time because that would allow the copper pads to oxidize.

Once the wafer is sufficiently dry to undergo packaging, the wafer is vacuum packed at step 16. The vacuum packing may be performed using generally known commercially available vacuum packing equipment. Preferably the wafer is packed in a shock proof container made of a non-reactive material.

When the die are ready to be packaged, the wafer is unpacked from the container and the packaging process may be started. In the packaging process, either ball bonding or wedge bonding may be performed. Further, as is understood by those of skill in the art, if polymer material is used for die attach, the polymer should be cured in an inert atmosphere to prevent oxidation.

Figure 2:
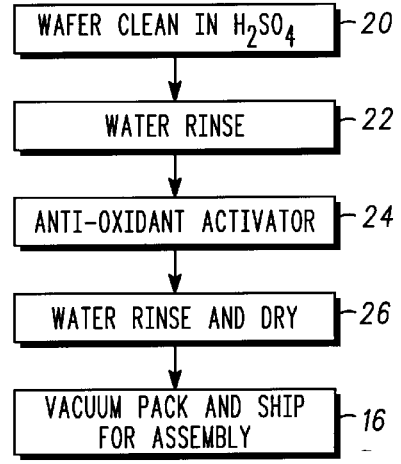
FIG. 2 is a block diagram illustrating the steps involved in the preparation of a semiconductor wafer having one or more integrated circuits formed thereon in accordance with a second embodiment of the invention.

Referring now to FIG. 2, a second method of preparing a semiconductor wafer having a plurality of integrated circuits formed thereon, the integrated circuits having pads formed of copper, is shown. Like the first embodiment, the second embodiment is preferably performed after the die on the wafer have been tested.

More particularly, after testing, the wafer is cleaned with an acid solution at step 20 and then rinsed with water at step 22. The wafer is preferably cleaned in step 20 by dipping or immersing the wafer in an acid bath at room or elevated temperature. The wafer is preferably dipped in the acid bath for between about 2 to 20 seconds and preferably, for about 10 seconds. Preferably, the acid solution is either $H_2SO_4$ or $HNO_3$, however, other acids may be used, such as phosphoric, hydrogen peroxide, hydrofluoric, and hydrochloric, which are commercially available and commonly used in semiconductor fabrication processes. The water rinse step 22 is preferably performed for about 2 minutes using deionized water at about 21 degrees C.

After the wafer is rinsed in step 22, an anti-oxidant activator is applied to the surface of the copper pads at step 24. Any of the commercially available anti-oxidants used in the semiconductor and lead-frame fabrication processes may be used. Preferably, the wafer is dipped or immersed in a bath of anti-oxidant activator. However, the activator may be applied in other known ways, such as by spraying.

After removing the wafer from the anti-oxidant bath, the wafer is rinsed with water and dried. Preferably, the wafer is rinsed using deionized water and then dried. The wafer may be dried with either ambient or warm air. Further, the drying may be performed using a commercially available blow dryer.

Finally, step 16 is performed, in which the dried wafer is vacuum packed in a container that is preferably shock proof and made of non-reactive material.

Figure 3:
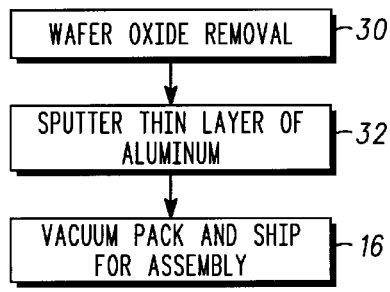
FIG. 3 is a block diagram illustrating the steps involved in the preparation of a semiconductor wafer having one or more integrated circuits formed thereon in accordance with a third embodiment of the invention.
Figure 5:
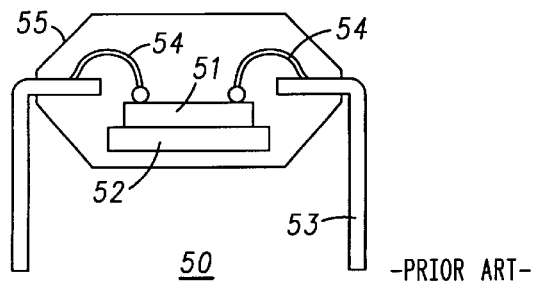
FIG. 5 is an enlarged cross-sectional view of a packaged integrated circuit die.

Referring now to FIG. 3, a third method of preparing a semiconductor wafer having a plurality of integrated circuits formed thereon, the integrated circuits having pads formed of copper, is shown. Like the first and second embodiments, the third embodiment is preferably performed after the die on the wafer have been tested.

More particularly, after testing, the oxide is removed from the wafer at step 30. The oxide may be removed from the wafer by performing the alkaline bath (step 10), acid neutralization (step 12) and drying (step 14) shown in FIG. 1 or by performing the acid bath (step 20), water rinse (step 22), anti-oxidant activator application (step 24) and water rinse and dry (step 26) shown in FIG. 2. However, the oxide removal step 30 may comprise molecular or plasma cleaning.

Plasma cleaning uses a high power radio-frequency (RF) source, microwave or direct current to convert gas into plasma. The high velocity gas ions bombard the bonding surface (i.e., the copper pads) and cleaning contaminants off of the bonding surface by physically and chemically breaking apart the contamination molecules. Plasma cleaning of semiconductors and lead frames are understood by those of skill in the art and machines for performing such plasma cleaning are commercially available. However, present plasma cleaning techniques do not adequately remove oxide from copper.

In conventional plasma cleaning, the gas ionized is oxygen, argon, nitrogen, 80% Ar+20% $O_2$, or 80% $O_2$+20% Ar. In addition, $O_2/N_2$ plasma has also been used. The inventors have determined that these gasses and combinations of gasses do not adequately clean the copper pads. Thus, according to the present invention, the plasma cleaning step is performed using a combination of about 5–10% Hydrogen and about 90–95% Argon. From experiments, it has been determined that the $H_2$ gas usage must be performed at an ultra low vacuum pressure to provide a longer mean free path for the cleaning ions to reach the surface to be cleaned. That is, the plasma cleaning preferably is performed at an ultra low pressure of between about 5 to 20 mTorres and with microwave power of about 800–1000 mWatts.

Once the oxide has been removed from the wafer, a thin layer of oxide passivation material, such as aluminum or other organic/inorganic coating is applied, preferably by sputtering on the copper pads, step 32. Sputtering/PECVD (Plasma Enhanced Chemical Vapor Deposition), also called partial vacuum evaporation, is a physical process that occurs in a vacuum chamber that contains a target, such as a solid slab of the film material, which in this case is preferably aluminum, and the wafers. Argon gas is introduced in the chamber and ionized to a positive charge. The positively charged argon atoms accelerate toward and strike the aluminum, dislodging the aluminum atoms. The dislodged atoms are deposited onto the wafer surface, including the surface of the copper pads. Sputtering forms a uniform thickness of the aluminum over the copper pads. In accordance with the present invention, the sputtering is performed for only about 2 to 3 seconds.

While it is known in the art to cover copper pads with aluminum in order to prevent oxidation, such conventional aluminum coverings are typically on the order of 10–20 KAngstroms thick. In contrast, the present invention uses sputtering/PECVD to provide a covering of aluminum or other inorganic/organic oxide passivation/PECVD material that preferably has a thickness of about 1–5 nanometers.

Finally, as with the previous two embodiments, step 16 is performed. That is, the dried wafer is vacuum packed in a shock proof container that is preferably made of non-reactive material.

The methods described above and shown in FIGS. 1–3 are directed to cleaning copper pads of an integrated circuit formed on a silicon wafer and vacuum packing the wafer so that the copper pads do not oxidize prior to wire bonding. Accordingly, more reliable wire bonds are formed using wafers that undergo the above-described methods.

Figure 6:
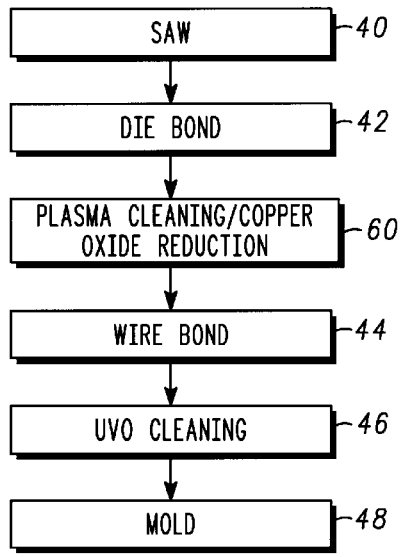
FIG. 6 is a block diagram illustrating the steps involved in the preparation of an integrated circuit device in accordance with a fourth embodiment of the invention.
Figure 4:
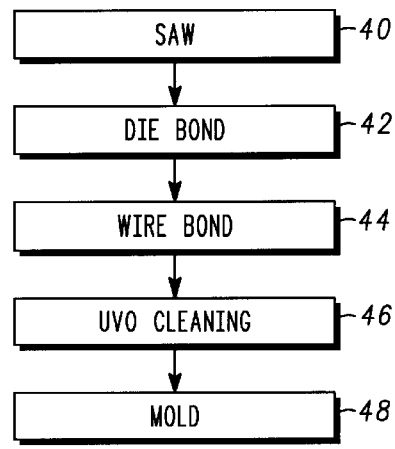
FIG. 4 is a block diagram illustrating the conventional steps involved in the preparation of an integrated circuit device.

Referring now to FIG. 6, a method of assembling semiconductors is shown that is similar to the conventional method shown in FIG. 4 and discussed above. However, as previously discussed, copper pads oxide very readily and so in order to provide for more reliable wire bonds, more care must be taken during assembly. Further, the inventors have determined that performing plasma cleaning (step 60) after the die has been cut from the wafer (step 40) and bonded to the die attach pad (step 42) and before wire bonding (step 44) will allow for more reliable wire bonds.

As discussed above with reference to FIG. 3, the plasma cleaning step is performed using a combination of about 5–10% Hydrogen and about 90–95% Argon. Further, the plasma cleaning preferably is performed at an ultra low vacuum pressure of between about 5 to 20 mTorres and with a microwave power of about 800–1000 mWatts.

After the die is cleaned, the wire bonding step 44 is performed, followed by the conventional steps of UVO cleaning, step 46 and encapsulating or molding, step 48.

As is apparent, the present invention provides methods for preparing wafers having die with copper pads such that when the die on the wafers are ready to be packaged, the copper pads have less oxidation and thus wire bonding of the pads yields more reliable bonds. The present invention further provides a method of preparing a wafer having die with copper pads during the die packaging process that reduces oxidation on the copper pads so that wire bonding of the pads yields more reliable bonds. As will be appreciated, the present invention is directed to preparing copper pads for wire bonding. The present invention is not limited to using copper wires for the wire bonding, as other wires could be used, such as gold or aluminum. Further, although the present invention has been performed using ball bonding, it is not limited to ball bonding, and may be practiced with wedge bonding.

The description of the preferred embodiments of the present invention have been presented for purposes of illustration and description, but are not intended to be exhaustive or to limit the invention to the forms disclosed.

It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

What is claimed is:

1. A method of preparing a semiconductor wafer having a plurality of integrated circuits formed thereon, the integrated circuits having pads formed of copper, the method comprising the steps of:

plasma cleaning the copper pads using about 5–10% Hydrogen and about 90–95% Argon; sputtering a very thin layer of a passivation material on a surface of the copper pads, said passivation layer having a thickness of about 1–5 nanometers; and vacuum packing the wafer in a shock proof container.

2. The method of claim 1, wherein the vacuum packing step comprises vacuum packing the wafer in a shock proof container.

3. The method of claim 1, wherein the passivation material comprises aluminum.

4. The method of claim 1, wherein the plasma cleaning is performed at an ultra low pressure of between about 5 to 20 mTorres.

5. The method of claim 1, wherein the plasma cleaning is performed using a power of about 800–1000 mWatts.

6. A method of preparing a semiconductor wafer having a plurality of integrated circuits formed thereon, the integrated circuits having pads formed of copper, the method comprising the steps of:

plasma cleaning the copper pads using about 5–10% Hydrogen and about 90–95% Argon; and vacuum packing the wafer in a shock proof container.

7. The method of preparing a semiconductor wafer of claim 6, further comprising the step forming a very thin layer of a passivation material on a surface of the copper pads.

8. The method of preparing a semiconductor wafer of claim 7, wherein the step of forming a passivation layer comprises sputtering a passivation material on a surface of the copper pads.

9. The method of preparing a semiconductor wafer of claim 7, wherein the passivation layer has a thickness of about 1–5 nanometers.

10. The method of preparing a semiconductor wafer of claim 7, wherein the passivation layer comprises aluminum.

11. The method of preparing a semiconductor wafer of claim 6, wherein the vacuum packing step comprises vacuum packing the wafer in a shock proof container.

12. The method of preparing a semiconductor wafer of claim 6, wherein the plasma cleaning is performed at an ultra low pressure.

13. The method of preparing a semiconductor wafer of claim 12, wherein the ultra low pressure is between about 5 to 20 mTorres.

* * * * *